United States Patent
Belschner et al.

(10) Patent No.: US 7,586,933 B2
(45) Date of Patent: Sep. 8, 2009

(54) NETWORK COMPRISING AN INTERCONNECTING NETWORK AND SEVERAL NETWORK NODES THAT ARE COUPLED TO SAID INTERCONNECTING NETWORK

(75) Inventors: Ing Ralf Belschner, Pliezhausen (DE); Bernd Hedenetz, Denkendorf (DE); Christopher Temple, München (DE); Anton Schedl, München (DE); Josef Berwanger, Poing (DE); Martin Peller, München (DE); Thomas Führer, Gerlingen (DE); Arnold Millsap, Leonard, MI (US); Thomas Forest, Macomb, MI (US); Gregor Pokorny, Vienna (AT); Peter Fuhrmann, Aachen (DE)

(73) Assignees: Robert Bosch GmbH, Stuttgart (DE); Bayerische Motoren Werke AG, Munich (DE); DaimlerChrysler AG, Stuttgart (DE); Freescale Semiconductor, Inc., Austin, TX (US); GM Global Technology Operations, Inc., Detroit, MI (US); NXP B.V., Eindhoven (NL); DECOMSYS—Dependable Computer Systems, Hardware und Software Entwicklung GmbH, Vienna (AT)

( * ) Notice: Subject to any disclaimer, the term of this patent is extended or adjusted under 35 U.S.C. 154(b) by 686 days.

(21) Appl. No.: 10/510,390

(22) PCT Filed: Apr. 4, 2003

(86) PCT No.: PCT/EP03/03506
§ 371 (c)(1),
(2), (4) Date: Jun. 14, 2005

(87) PCT Pub. No.: WO03/088590
PCT Pub. Date: Oct. 23, 2003

(65) Prior Publication Data
US 2005/0232224 A1 Oct. 20, 2005

(30) Foreign Application Priority Data
Apr. 16, 2002 (DE) ............................. 102 16 984

(51) Int. Cl.
*H04L 12/413* (2006.01)
(52) U.S. Cl. .................... 370/447; 370/254; 370/257
(58) Field of Classification Search ............... 370/445, 370/446, 447, 448, 498, 503
See application file for complete search history.

(56) References Cited

U.S. PATENT DOCUMENTS 4,005,266 A    1/1977   Lehr (Continued)

OTHER PUBLICATIONS

Christopher Temple "Avoiding the Babbling-Idiot Failure in a Time-Triggered Communication System". 28th International Symposium on FTCS, Jun. 1998, Munich/ Germany.

*Primary Examiner*—Bob A Phunkulh
(74) *Attorney, Agent, or Firm*—Paul Vincent

(57) ABSTRACT

The invention concerns a network comprising an interconnecting network and several network nodes that are coupled to said interconnecting network and are designed to adapt their local communication time schedule to the communication time schedule of at least one other network mode, prior to being integrated as active network nodes. A network node to be integrated checks the activity of other network nodes and if no activity is identified, sends out positional messages for other network nodes, said message being fixed by predetermination in its communication time schedule. If a network node cannot be integrated as a reference node, it can only be integrated as an active node if it adapts its local communication time schedule to that of the reference node after receiving positional messages and if a check as to whether its own communication time schedule agrees with the communication time schedules of at least some of the active network nodes proves positive.

8 Claims, 4 Drawing Sheets

U.S. PATENT DOCUMENTS

| | | |
|---|---|---|
| 4,628,311 A | 12/1986 | Milling |
| 4,747,100 A | 5/1988 | Roach |
| 5,289,466 A | 2/1994 | Nobutoki |
| 5,444,851 A * | 8/1995 | Woest .................. 709/222 |
| 5,694,542 A | 12/1997 | Kopetz |
| 5,923,663 A | 7/1999 | Bontemps |
| 5,995,559 A | 11/1999 | Hedberg |
| 6,118,603 A | 9/2000 | Wilson |
| 6,185,247 B1 * | 2/2001 | Williams et al. ............ 375/212 |
| 6,246,702 B1 | 6/2001 | Fellman |
| 6,308,068 B1 | 10/2001 | Kuenkel |
| 6,449,290 B1 | 9/2002 | Willars |
| 6,473,450 B1 | 10/2002 | Sutterlin |
| 6,748,451 B2 | 6/2004 | Woods |
| 6,944,804 B1 | 9/2005 | Kim |
| 7,035,246 B2 * | 4/2006 | Taylor ...................... 370/350 |
| 2005/0094674 A1 * | 5/2005 | Zinke et al. ................ 370/507 |

* cited by examiner

NETWORK COMPRISING AN INTERCONNECTING NETWORK AND SEVERAL NETWORK NODES THAT ARE COUPLED TO SAID INTERCONNECTING NETWORK

This application is the national stage of PCT/EP03/03506 filed on Apr. 4, 2003 and also claims Paris Convention priority of DE 102 16 984.5 filed on Apr. 16, 2002.

BACKGROUND OF THE INVENTION

The invention concerns a network comprising an interconnecting network and several network nodes which are coupled to the interconnecting network and are each configured, before being integrated as an active network node, for adaptation of their local communication time schedule to the communication time schedules of at least one other network node.

A network of this type can be used in automotive vehicle technology and can be derived e.g. from the magazine "Elektronik", No. 14, 1999, pages 36 through 43 (Dr. Stefan Polenda, Georg Kroiss: "TPP: "Drive by Wire" in greifbarer Nähe"), wherein the TTP protocol (TTP—time-triggered protocol) is used. This protocol permits reliable data transmission and can therefore also be used in networks for safety-relevant devices (e.g. brakes).

It is the underlying purpose of the invention to provide a network comprising an interconnecting network and several network nodes which are coupled to the interconnecting network, which permits synchronization of the network nodes after starting the network.

SUMMARY OF THE INVENTION

The object is achieved with a network of the above-mentioned type comprising the following features:

The network contains an interconnecting network and several network nodes which are coupled to the interconnecting network and are each configured, before being integrated as an active network node, for adaptation of their local communication time schedule to the communication time schedules of at least one other network node, wherein a network node to be integrated checks the activity of other network nodes and, if no activity is determined, serves as a reference network node for fixed transmission of position messages for other network nodes, which are predetermined in its communication time schedule, and a network node is provided for integration as an active network node after receipt of position messages for adaptation of its local communication time schedule to that of the reference network node and in case of a positive examination result for agreement between its own communication time schedule and the communication time schedules of at least part of the active network nodes.

The invention concerns a network which ensures error-tolerant synchronization of the network nodes which are coupled via an interconnecting network after starting or loading the network. The interconnecting network may comprise any network topology and may transmit messages from or to the network nodes with or without signal amplification. A distributed synchronous data bus, a star coupler etc. can be used as network topology.

A common communication time schedule must be established in the network nodes of the network. In accordance with the invention, the network node which attempts to define the communication time schedule for all other network nodes changes dynamically during operation. A statically determined, particularly characterized network node which solely determines the global communication time schedule and thereby solely permits initial synchronization of the local communication time schedules is not used.

The communication time schedule represents the time dependence of the data exchange which describes exactly when a certain network node transmits certain data to the other network nodes and to the interconnecting network. The time schedule is already determined before operation. The overall data exchange between the network nodes is integrated into this time schedule.

Synchronization is rendered possible using position messages which are transmitted by each network node at a certain point in time which is predetermined by its respective local communication time schedule. The network node which does not receive any position messages from other network nodes is the reference network node for network nodes to be integrated or synchronized at a later time. The other network nodes then try to adjust their respective local communication time schedule to that of the reference network node. If a network node has received the position messages of the reference network node and if its local communication time schedule has been adjusted to that of the reference network node, an examination phase follows in accordance with the invention. In this examination phase, it is determined whether the previous adaptation is correct and integration as an active network node transmitting its own position messages is effected only after a positive result is obtained.

The invention ensures that the network nodes establish a common communication plan. A statically determined, particularly characterized network node which is the sole node dictating the global communication time schedule and thereby permitting initial synchronization of the local communication time schedules, is not used. The network node which tries to predetermine the communication time schedule for all network nodes, changes dynamically during operation.

Synchronization of a communication time schedule of a network node with one individual network node with erroneous operation compared to the other active network nodes is thereby prevented. An integrating network node selects the first network node from which a message is received as the reference network node for determining the current position in the communication time schedule. Only after adaptation of its own communication time schedule, is the established individual view compared with that of all other available network nodes. Only if it is possible to determine that the local communication time schedule of the network node corresponds to the global communication time schedule, can it actively participate in the communication and be transferred to normal synchronized operation. Since the first step merely requires evaluation of information of a network node, i.e. of the reference network node, and not all available nodes are used for initial synchronization of the local communication time schedule, the method operated in the network can be realized with little expense. Measures for error-tolerant evaluation are not yet required in this phase. The error tolerance for the overall method is ensured by the final examination phase.

A network node examines whether its own communication time schedule agrees with the communication time schedules of at least part of the active network nodes and counts the agreements and deviations. It is only integrated as an active network node if the number of agreements is higher than the number of deviations, or if there is no deviation. Moreover, the network node examines whether its own communication time schedule coincides with the communication time schedules of at least part of the active network nodes during a time interval for which all position messages of the other network nodes which take part in the communication are transmitted at least once.

If no activity is detected, a network node to be integrated examines whether a further network node is attempting to be integrated as a reference network node. A collision message can be used in this case. If at least two network nodes simultaneously try to initiate first communication, collision recognition is not required, since the inventive network ensures that, after a resolution phase, only one network node remains as an active node on the network. Towards this end, a network node initially transmits its own position message, counts incoming position messages and is integrated as a reference network node only if the number of correctly received position messages is larger than the number of incorrectly received position messages or if all position messages are correctly received.

The invention also concerns a network node in a network comprising an interconnecting network and several further network nodes which are coupled to the interconnecting network, and to a method for integration of a network node as an active network node in a network with an interconnecting network and several further network nodes which are coupled to the interconnecting network.

Embodiments of the invention are explained in more detail below with reference to the drawing.

DESCRIPTION OF THE PREFERRED EMBODIMENT

Figure 1:
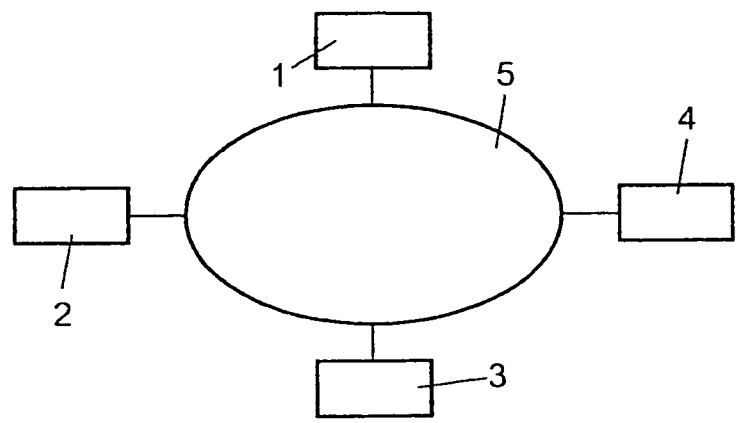
FIG. 1 shows a network comprising several network nodes and an interconnecting network.

FIG. 1 shows one embodiment of the inventive network. This network contains e.g. four network nodes 1 through 4, which are each coupled to an interconnecting network 5. The interconnecting network 5 represents any network between the connected network nodes 1 through 4. The connected network nodes 1 through 4 exchange messages via this interconnecting network 5 such that the message of a transmitting network node can be received by all connected network nodes. The interconnecting network 5 may have any network topology and transmit the message without signal amplification (passively) or with signal amplification (actively). An interconnecting network in the form of an active star coupler is disclosed e.g. in EP 1 179 921 A2. The message transmission may thereby be effected via different transmitting media (electrical wire, optical transmission or wireless transmission e.g. radio or infrared transmission). The interconnecting network may comprise more than one communication channel, i.e. consist e.g. of a redundant interconnecting network with two or more communication channels.

Each network node 1 through 4 comprises at least one communication interface (not shown) which ensures exchange of messages via the interconnecting network 5 and a control and processing unit (not shown) which configures and controls the communication interface. The control and processing unit determines when the associated network node may participate in the communication via the interconnecting network 5 (release) and which data is transmitted using the messages or how the received data contents (useful data) are to be processed.

For many control and automation applications which exchange application data via such an interconnecting network 5, it must be ensured that this application data is available with fixed temporal definition for each network node (1 through 4) or participant. Under these preconditions, application data which is processed only in connection with its temporal occurrence or the order in which it must be processed with other data, cause a specified system or application function.

The requirement for predeterminable occurrence of messages in a network is met e.g. through the so-called "time-controlled communication" or through a "time-controlled protocol". A time-controlled protocol is based on a communication time schedule, whose timing was already determined before operation. The overall data exchange between the network nodes 1 through 4 is integrated in this time schedule. A time schedule for data exchange (communication time schedule) is produced which describes exactly which network node will transmit certain data to the other network nodes (1 through 4) and to the interconnecting network 5 and at which time. The communication time schedule may also contain a reserved section wherein the message sequence is determined dynamically during the running time. Such a section within the communication time schedule is, however, not relevant for further discussion and is treated merely as reserved region.

To realize this communication time schedule, a strict predictability must also be possible for access to the communication medium (interconnecting network). The TDMA method (time division multiple access) is thereby often used. Conflict-free access to a common communication medium is regulated in that a network node receives the exclusive right of transmission only for a short section within a time interval, referred to as message slot or message time slot. For static allocation of the right of transmission, the overall interval, which is referred to as the communication cycle, comprises the message time slots for all network nodes and is repeated periodically. Communication protocols thereby also permit a network node to be associated with several message time slots within one communication cycle.

In a communication system (network) which is based on TDMA, each network node requires common time information which is matched among all participants, and which can be distributed e.g. through a central network node (time server) to all other network nodes. A central network node is unsuitable for safety-relevant and error-tolerant systems (e.g. electronic braking system of a vehicle), since failure of this component stops the entire communication. Time-controlled protocols such as e.g. the TTP method (time-triggered protocol) define a local time for each individual network node which is synchronized with other system participants to provide global correspondence. Towards this end, a granularity or resolution which can be uniformly used within the system is fixed for the global time. It must be guaranteed that all network nodes, within the fixed resolution, have a uniform view of the global time. For synchronized normal operation, each network node has a measuring phase to determine deviations between its local time and the local times of the other network nodes (which are stored in the respective network node). After receipt of a synchronization message, the respective corresponding time of receipt is compared with the expected time derived from the local clock time. Through evaluation of all available deviations from the other network nodes represented by their synchronization messages, each network node can determine correction terms. The frequency of the clock cycle of the local clock can thereby be adjusted temporarily or permanently and displacement of the phase positions between the local communication time schedules of the respective network nodes are added up during the measuring phase and can be additionally balanced in a correction phase. The position of the measuring phase and of the correction phase, which may overlap, must be synchronized in all nodes.

The processing of a communication time schedule of a network node is based on its local clock cycle. The length of a local communication cycle therefore depends on the local clock cycle. Global clock synchronization during synchronized normal operation keeps the local communication cycles in global correspondence.

In all communication systems (networks) whose media access method requires synchronization of the participating network nodes, suitable methods must ensure that the network nodes pass from the non-synchronized state into the synchronized state after activation. In the synchronized state, the communication time schedules locally administered in the network nodes coincide such that each active network node can use its reserved message time slots and a message sent therefrom falls into the same message time slot reserved for this transmission for all other network nodes.

A common communication time schedule must be established in the network nodes 1 through 4 of the network. In accordance with the invention, that network node which tries to predetermine the communication time schedule for all other network nodes is determined dynamically during operation.

Figure 2:
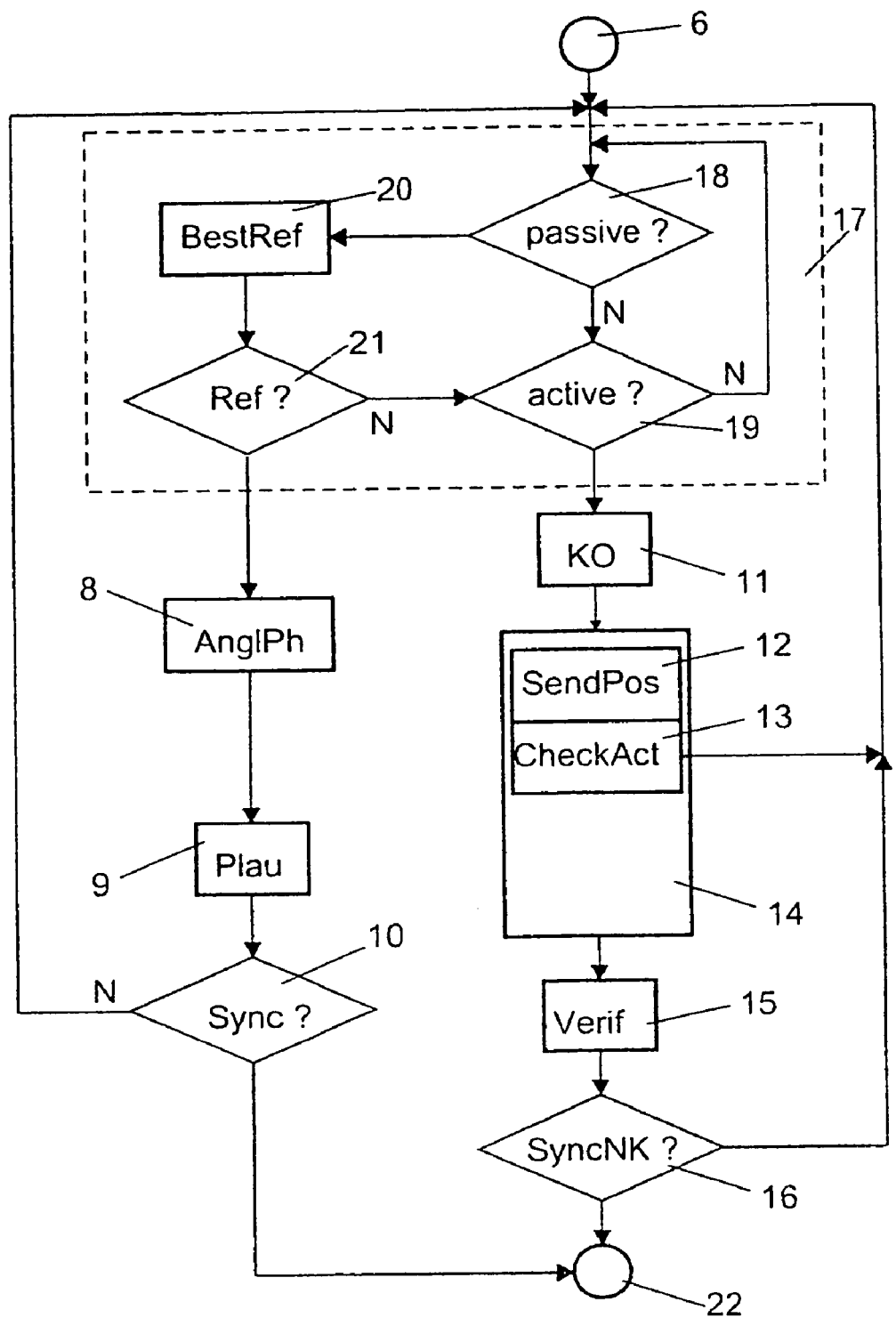
FIG. 2 shows a first flow chart which can be applied in a network node.

The synchronization of all network nodes to a global communication time schedule is shown using the flow chart of FIG. 2.

Before release by a superior control unit (not shown in detail), the control unit performs all required settings for participation in the communication on the network node. Each network node knows the global communication time schedule and its own message time slots to be used for message transmission within this communication time schedule.

If a network node was released by the superior control unit (circle 6 in FIG. 2), the network node must decide which function to assume in the network. There are two possibilities for transfer of a network node into synchronized normal operation. The network node either runs through a first path in the flow chart with blocks 8 through 10, wherein it synchronizes its local communication time schedule with at least one of another network node which actively transmits position messages, or a second path with blocks 11 through 16, wherein it actively tries to start a communication. In the synchronized state of the network, all network nodes or only certain network nodes (defined subset of network nodes) transmit at least one position message per communication cycle. The position messages are a regular part of the global communication time schedule.

The decision which path a network node chooses is made in a superior block 17 (shown in broken lines in FIG. 2). The phase represented by block 17 concerns network observation and the selection of the first or second path. After release by the superior control unit, a network node does not immediately start transmission but waits for a predetermined observation time interval to determine whether a message is received. This is symbolically shown in an inquiry block 18 through the inquiry "passive?". If there is no activity in the network, i.e. the network node has determined a rest phase, it checks whether it can get active itself which is represented in the inquiry block 19 through "active?". If the answer to this question is yes, the network node moves into path 2 to block 11. If no such observation time interval without any network activity was observed, the network node is returned to block 18 by inquiry block 19. During error-free operation, the observation time interval must be selected sufficiently large such that an unsynchronized network node recognizes another network node which generates transmitting activity in accordance with the communication time schedule, as an already active network node.

Each activity in the network which is received by a network node causes renewed start of the observation time interval. Messages which cannot be used for integration of the network node, cause new start of the observation time interval just like disturbances which have overcome a possible disturbance filter in the receiving path of the network node.

If a position message is received within this observation time interval, the network node goes to block 20 at the inquiry block 18. The receipt of a position message enables the network node to adjust the phase position of its local communication time schedule to the global communication time schedule of the network node (reference network node) from which the position message has been transmitted.

The global communication time schedule is defined in that all active network nodes place their messages in accordance with their local communication time schedule. If these network nodes are all synchronized, a uniform, global communication time schedule can be observed in the network.

A network node which has not yet processed a synchronized communication time schedule and therefore does not actively participate in the transmission, can derive the phase position of the global communication time schedule through receipt of a position message from a reference network node. Since it only receives information about the phase position of the local communication time schedule of the selected reference network node, this is valid only when the local communication time schedule of the reference network node corresponds to the global communication time schedule.

It is initially assumed that this assumption (reference network node predetermines the global communication time schedule) is valid and only in a later phase, however, still before entry into synchronized normal operation (before the network node may actively participate in the communication), this assumption is checked and the decision revised, if necessary.

The associated transmitting network node is determined from the position message and stored as the reference network node (indicated in block 20 through "BestRef"). If only one position message for a network node in the communication time schedule is admissible, the determination of the reference network node can be omitted and the position information, e.g. the number of the message time slot can be stored for unambiguous reference identification. This information is then synonymous with the knowledge about the associated transmitting network node and permits unambiguous identification of the position information from this network node for synchronization of the communication time schedules.

The inquiry block 21 following block 20 is also part of block 17 as are blocks 18 through 20, and determines whether the selected reference network node may be used as reference for adaptation of the phase position of its own local communication time schedule to that of the reference network node (represented by "Ref?"). This inquiry is successfully passed since there are no limitations with respect to the admissible reference network node for the first integration attempt (entry into the first path). These limitations are generated only in case of unsuccessful integration, i.e. leaving of the first path and reentry into block 17, i.e. the associated reference network node may not be directly used again for a further integration attempt.

Figure 3:
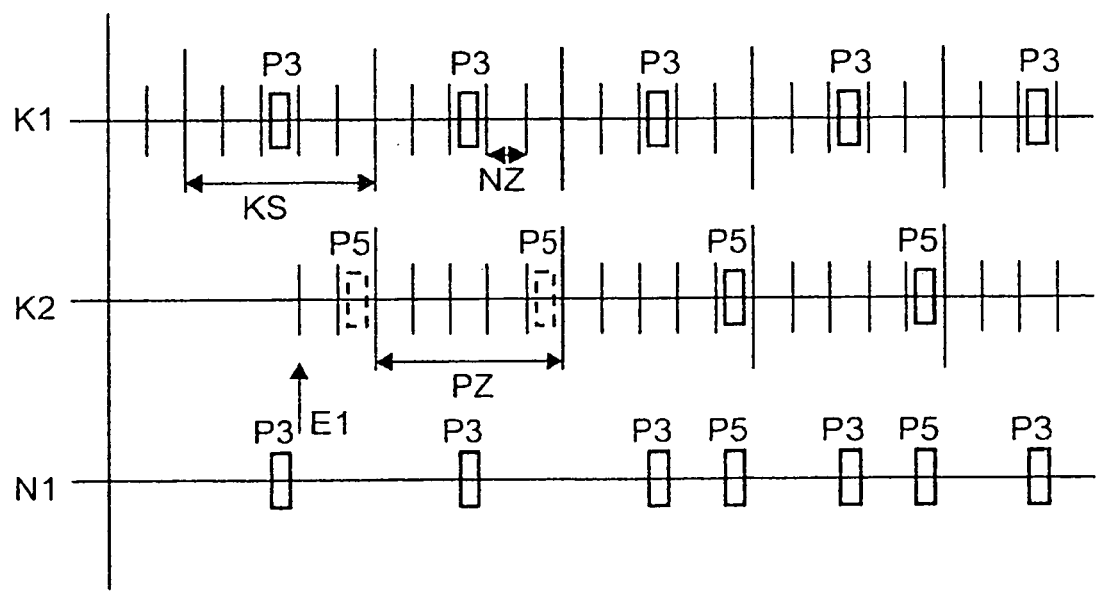
FIG. 3 shows a first timing diagram to explain the inventive network.

Entry into the first path permits the network node to determine the phase position of its own local communication time schedule (clarified in FIG. 3). The time dependences of two network nodes K1 and K2 and of the position messages (P3, P5) of network N1 are thereby shown. The network node K1 is thereby selected as reference network node by the network node K2. Each communication cycle KS (illustrated in FIG. 3 using long vertical lines) comprises 5 message time slots NZ in accordance with the communication time schedule. The individual message time slots within a communication cycle are symbolized by shorter vertical lines. The position message P3 of the network node K1 occupies the third message time slot. The active transmission of this position message P3 is shown by a rectangle having solid lines. The position message P5 of the network node K2 occupies the fifth message time slot. Further network nodes which occupy the other message time slots in the communication time schedule are not shown for reasons of clarity.

Information about transmission of the position message of the network node K1 in the third message time slot can be derived directly from the position message. The network node K2 can therefore determine the phase position of the communication time schedule of the network node K1 after receipt of the position message P3 and appropriately adjust the position of its own communication time schedule. This is shown in the flow chart by "AnglPh" in block 8. If the length of the message time slots is fixed and if the current message time slot is known, the network node K2 can calculate the current position within the communication cycle. The phase position of the communication time schedule is therefore known to the network node K2. This point in time is characterized in FIG. 3 by the event E1. After receipt of the position message P3 and calculating a phase (see flow chart of FIG. 2, block 8), the network node K2 knows the current position within the communication cycle. The network node K2 can then precisely adjust the phase position of its local communication time schedule. The square with broken lines in FIG. 3 symbolizes the position of the position message of the synchronized network node K2 after the phase "AnglPh". However, this message is not yet actively transmitted. The message P5 is therefore not yet visible on the network N1 at this time.

After expiration of the current communication cycle, the network node K2 enters phase "Plau", which is represented in FIG. 2 by block 9. This phase verifies whether integration of the network node K2 into the network N1 was successful. The network node K2 can evaluate messages received after initial synchronization in the test phase "Plau" using its own communication time schedule. On the basis of the incoming position messages, the network node K2 checks whether its understanding about the current position of the transmitting network node in the communication cycle is correct. The test time interval PZ used in this connection, which utilizes a network node K2 to check its own view compared to that derived from the received position messages of the other network nodes, is predetermined. It comprises at least one communication cycle to include all network nodes in the test which are currently active. The test time interval is preferably synchronized with the communication cycle, i.e. it starts at the beginning of a communication cycle. All network nodes which are currently in the test phase of the first path, and also network nodes which are currently in the test phase of the second path (explained below) use the same information basis, i.e. the same set of network nodes, to make a decision.

During the test time interval, each network node which communicates the phase position of its local communication time schedule through its position message is classified into a category. The local phase position of the communication time schedule in the transmitting network node either agrees with that of the integrating network node or not. In both cases, a respective corresponding counter is incremented for the agreements (Z_over) and the deviations (Z_less). At the beginning of the test time interval, these counters are initiated with 0 and evaluated at the end of the test time interval. Each network node is considered only once within the test time interval.

After expiration of the test time interval PZ (block 9), block 10 examines whether synchronization of the network node to be integrated was successful which is shown by "Sync?". Different rules may be applied in this connection.

A first rule may state that a network node is not synchronized if, at the end of the test time interval, the count value Z_less is larger than zero. In this case, there is at least one active network node in the network whose local communication time schedule is not synchronized with that of the network node to be examined (and therefore also not with the communication time schedule processed by the reference network node). If the count value Z_less is zero, the count value Z_over must be one or more in order to pass the inquiry block 10, since otherwise the reference network node is no longer active, which is also an indication of error. If a network node is configured to transmit no position message in accordance with the communication time schedule, Z_over must be at least two, since such a network node cannot transfer a network node in the second path, which is trying on its own to start communication, into the synchronized normal operation. Since a network node in the second path recognizes only through position messages that a communication between at least two network nodes was established, a network node which transmits no position messages may be integrated merely into an existing communication between at least two network nodes which transmit position messages.

A second rule may permit synchronization of a network node even if erroneous network nodes are present. Availability of communication is then a criterion for optimization, wherein for passing the inquiry block 10, the count value Z_less must not exceed a fixed value, the count value Z_over must not fall below a fixed value or a plurality of agreements (Z_over>Z_less) are required. The majority decision is advantageous since it permits an unambiguous statement irrespective of the number of active network nodes used to come to a decision. If the count values Z_less or Z_over are fixed, the relationship to the overall number of network nodes must be taken into consideration in the evaluation. Also in this case, Z_over must be at least two for a network node which does not transmit its own position message in accordance with the communication time schedule.

If the test phase "Plau" has been successfully terminated after application of one of the two above-mentioned rules in the inquiry block 10, the network node may pass into synchronized normal operation. In this manner, the network node also obtains the transmitting authorization in accordance with the communication time schedule.

FIG. 3 shows the test phase PZ which is exactly the length of one communication cycle. Since in this phase merely the reference network node K1 can be evaluated by the network node K2, which has predetermined the phase position of the local communication time schedule in the network node K2 (network node K1 is the reference network node for K2), the test in this example is, of course, successful (count value Z_over=1). At the start of the following communication cycle, the network node K2 may actively participate in the communication (shown by circle 22 in FIG. 2), i.e. it is in synchronized normal operation. This is shown in FIG. 3 in that the position message P5 is actively transmitted by the network node K2 (square with fully drawn line) and therefore appears on the network N1.

If a network node determines in the inquiry block 10 that the condition is not met, it returns to block 17 and 18. In this case, the network node must decide again via inquiry blocks 18 and 19 whether it enters the first or second path. In contrast to the case, wherein the network node enters block 17 directly after release by the superior control unit, integration, guided by a particular reference network node has failed already at least once. This information is evaluated in a decision for passive integration via the first path in the inquiry block 21. After receipt of a position message, the network node can leave the inquiry block 18 to proceed to block 20 within the block 17 since a position message permits synchronization of the local communication time schedule. Based on this position message, the associated network node which has transmitted this position message is determined in block 20 and stored as reference network node. Subsequent inquiry in the inquiry block 21 must ensure that a network node does not permanently and exclusively try to repeatedly synchronize its communication time schedule with the communication time schedule of the same reference network node. Lack of such a mechanism could produce one of the following undesirable situations:

A malfunctioning network node whose position message permits entry of other network nodes into the first path, but whose communication time schedule is not synchronized with the global communication time schedule which other, already active network nodes follow, can prevent any integration of further network nodes. If this network node occupies the first message time slot of a communication cycle, all network nodes which leave the first path after unsuccessful examination via the inquiry block 10, directly select the same malfunctioning network node for the following integration attempt. This process would be repeated again and again without the measures of the suggested mechanism, and prevent integration of further network nodes for as long as the malfunctioning network node remains active.

The inquiry block 21 must therefore ensure that, after at least one failed integration attempt, another active network node (not the network node which was previously used as reference network node for the failed integration attempt) has the chance to be selected as reference network node by a network node in block 17. At the same time, a momentary disturbance (e.g. a transmitting disturbance which prevents correct receipt of a position message) must not be allowed to cause a network node to leave the first path and permanently exclude the actual reference network node in further integration attempts. The network node could thereby not be transferred to the synchronized normal operation even if the excluded network node operates without error after the failed integration attempt.

To avoid these problems, the following methods are e.g. used:

In a first method, the network node which reenters from the first path into block 17 stores the previous reference network node used for entrance into the first path as Kref_old. The network node Kref_old is not accepted as reference network node for a fixed dwell time interval, i.e. if a corresponding position message is received by this network node, the network node remains in block 17. If during this dwell time interval, a position message is received from which a new reference network node Kref_new can be determined in block 20, wherein Kref_new is not equal to Kref_old, the network node may leave the inquiry block 21 in the direction of the first path (block 8).

To avoid permanent exchange between two erroneous network nodes, a fixed or arbitrary number of position messages which were received during the dwell time in block 17, can be omitted before the inquiry block 18 is left again towards block 20 and renewed entry into the first path is possible. After expiration of the dwell time interval without reentering the first path, the reference network node Kref_old which was prohibited up to then, may be used again as a new reference network node for further entry into the first path under the precondition that a new position message is received by this reference network node Kref_old and the corresponding network node is determined in block 20 with Kref_new=Kref_old. The dwell time interval is restarted with each transfer between the inquiry block 10 and block 17. The duration of the dwell time interval should suitably be selected such that an active network node can be selected as reference network node from the set of all network nodes.

In a second method, a network node which reenters block 17 from the first path, stores the previous reference network node used for entry into the first path as Kref_old. The network node Kref_old is not accepted as reference network node for a fixed dwell time interval, i.e. if a corresponding position message is received by this network node, the network node remains in block 17. During this dwell time interval, the network node decides on the basis of a stored data base, which network node is used as reference network node for a further integration attempt. The inquiry block 21 is left towards the first path only if the reference network node Kref_new determined in block 20 is stored in the data base. This data base and the associated order in which the network nodes are used as reference network nodes, can be statically configured or be dynamically generated during the phase in which a network node remains in the first path. The dynamically generated data base must contain an entry for each position message, which was received while the network node was in blocks 8 and 9.

This second method also permits that after expiration of the dwell time interval without renewed entry into the first path, the reference network node Kref_old which was prohibited up to now may be used again as a new reference network node for further entry into the first path under the above-mentioned conditions.

The data base may also facilitate complicated algorithms which permit longer monitoring of the previous course for integration of a network node. All network nodes which have been used as reference network nodes for a failed integration attempt, may be blocked as reference network nodes until all network nodes which are stored in the data base have been used once as reference network nodes.

A further dwell time interval may be additionally defined which is started at the first failure of an integration attempt. After its expiration, all network nodes are used again as reference network nodes. All network nodes are thereby available as potential reference network nodes if integration was not possible by the method for selection of a reference network node on the basis of the described data base.

The following describes what happens if a network node has a positive answer to the inquiry in the inquiry block 19 and enters the second path. It then tries to actively establish communication. In a first step, the possibility must be addressed that more than one network node enters the second path.

Figure 4:
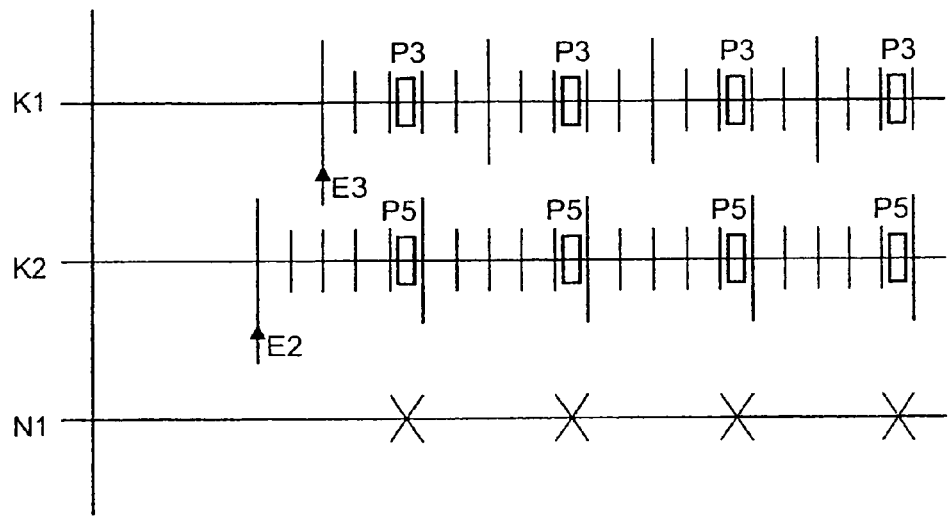
FIG. 4 shows a second timing diagram to explain the inventive network.

If the collision symbol KO is not transmitted, the situation shown in FIG. 4 may occur. The network node K2 enters the second path at event E2 and the network node K1 with a time delay at event E3 (two message time slots later). The events E2 and E3 are triggered after expiration of the inquiries in the inquiry blocks 18 and 19 in block 17. Both network nodes K1 and K2 start their communication cycle locally and transmit their position messages in accordance with the communication time schedule. The network node K1 transmits the position message P3 and the network node K2 simultaneously transmits the position message P5. Both messages collide on network N1 and can therefore not be correctly received by other network nodes. If the collision cannot be recognized by the transmitting network nodes K1 and K2, as is the case e.g. for optical transmitting media, both network nodes will continuously try to establish communication. Since the other network nodes cannot receive a correct position message, and at the same time, permanent network activity prevents entry of a further network node in the second path, communication between the network nodes of the network is permanently blocked.

The second path therefore starts in the flow chart with the statement that a collision symbol KO is initially transmitted (block 11). The communication time schedule is subsequently periodically processed. The collision symbol KO is not an element of the communication time schedule. The collision symbol KO may have any characteristics but it may not be a valid position message.

Figure 5:
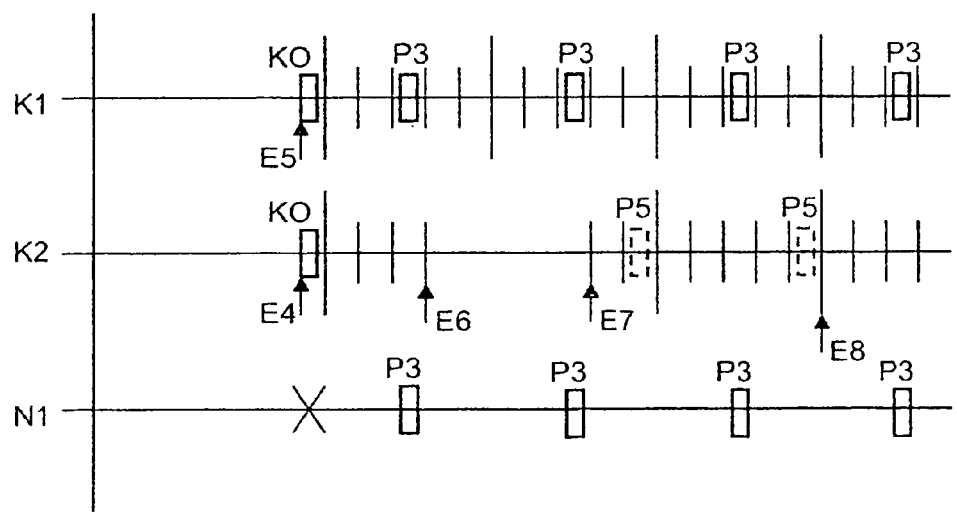
FIG. 5 shows a third timing diagram to explain the inventive network.

The effect of introduction of the collision symbol KO for solving a situation with more than one network node in the second path is shown in FIG. 5. A unique time interval exists in the network between the collision symbol KO and the individual position message in accordance with the communication time schedule due to the fact that each network node transmits this collision symbol KO before processing its local communication time schedule. This means that the network nodes which enter the second path at the same time and transmit a collision symbol KO, will in any event issue their position message in the following respective communication cycle at different times. Collision of position messages of different network nodes is no longer possible. A network node can thereby receive a position message which is present in the communication time schedule before its own position message and can be observed on the network. This network node subsequently leaves the second path and returns to block 17. Only the network node which was the first to transmit its position message remains in the second path.

FIG. 5 shows that the network nodes K1 and K2 enter simultaneously into the second path after simultaneous expiration of the observation time intervals in block 17 (events E4 and E5). The network node K1 and also the network node K2 transmit their respective collision symbol KO. Both network nodes subsequently start processing their local communication time schedule. The collision symbol KO synchronises both network nodes within the second path. A time delay between two network nodes in the second path as shown in FIG. 4, which would be possible in a system without collision symbol KO, can no longer occur. As soon as a network node enters the second path at an earlier time than another network node, it prevents entry of further network nodes into the second path through transmission of the collision symbol KO which causes a new start of the observation time interval for the remaining network nodes in block 17.

In accordance with the communication time schedule, the network node K1 is the first to transmit its position message P3 (see FIG. 5). This is shown in the flow chart in block 12 by "SendPos". The position message P5 of the network node K2 occurs later in the communication time schedule. The network node K2 no longer transmits its position message P5, since it receives the position message P3 from the network node K1 (event E6). The examination whether another network node has already transmitted a position message is shown in the flow chart of FIG. 2 in block 13 through "CheckAct". If a network node (network node K2) has detected a position message, it leaves the second path and moves from block 13 to block 17 to start a new observation time interval. FIG. 5 moreover shows that the network node K2 enters the first path upon receipt of the subsequent position message P3 (event E7). The inquiry blocks 18 and 21 are thereby passed and the network node K2 selects the network node K1 as the reference network node. The available position information P3 permits appropriate adjustment of the phase position of the local communication time schedule of the network node K2. The network node K2 subsequently passes the test phase "Plau" in block 9 which is successfully terminated since the reference network node K1 is used as single network node for examination and confirms the phase position of the local communication time schedule of the network node K2 (K_over=1, K_less=0). At the start of the next communication cycle, the network node K2 passes into synchronized normal operation (event E8).

In the phase in block 14, a network node transmits its position message (block 12, phase "SendPos") in accordance with the communication time schedule. During the remaining time, i.e. when the network node is not actively transmitting, it checks whether receipt of transmitting activity from another network node is possible (block 13, phase "CheckAct") on the connecting network. The network node remains in the block 14 phase for a fixed number of communication cycles. The phases "SendPos" and "CheckAct" are thereby not successive in time, but are performed in accordance with the communication time schedule.

Various rules can also be defined to influence the decision during the test "CheckAct" in block 13, as to whether a reception event occurred, which causes transfer to block 17.

For a network which does not react to malfunctioning network nodes or disturbed messages or tolerates the occurrence of errors, the following rule may be defined:

Each correct position message is evaluated as a received event in block 13 and causes a network node to subsequently return to block 17, thereby ensuring that only one network node remains in the second path.

For a network which tolerates malfunctioning network nodes or disturbed messages, i.e. must react to their behavior in a predetermined manner, the following rule may be defined:

Each correct position message, and also a collision symbol or a disturbed message (which can be detected e.g. by a detected error in a code safety method, such as e.g. a CRC test sum) is evaluated as a received event in block 13. This rule may be extended such that the reception of a certain partial feature of a message or even any type of network activity which overcomes a possibly existing disturbance filter in the receiving path, is evaluated as a received event in block 13. The less specific the definition of a received event for a network, the more sensitive is the reaction of a network node in the second path to disturbances or to malfunctioning network nodes. The network node in the second path then returns to the initial phase in block 17 and observes the further communication proceedings, i.e. restarts its observation time interval.

The predetermined number of communication cycles, during which a network node remains in block 14, depends on the duration of the phases of the blocks 8 and 9. It must be prevented that a network node in the first path successfully passes the inquiry block 10, whereas the reference network node returns to block 17 through a slight disturbance in the phase in block 14. A condition for dimensioning of the time intervals in block 14 and in blocks 8 and 9 relative to each other is therefore:

The network node in the second path must no longer be in block 14 but must already be in block 15 when a network node in the first path processes its test time interval, at the end of which synchronized normal operation may be entered via inquiry block 10.

For the flow chart shown in FIG. 2, a communication cycle is sufficient for processing in block 14, if processing in block 8 is terminated within the communication cycle in which the position message for reference determination was received and the test time interval (block 9) starts with the next communication cycle. Within this one communication cycle in block 14, the parallel entry of more than one network node into the second path is also addressed. If the duration of the phase of block 8 is longer, the length of the phase in block 14 is also adjusted (prolonged) for the network. It is important that a network node in the second path remains in the block 14 phase for as long as possible to be able to react to all possible errors (block 13).

If the network node in the second path has remained in block 14 for the predetermined number of communication cycles, and was not reset through passage to block 17, it passes on to block 15. While the network node is in the block 15 phase, it continues to transmit its position message in accordance with the communication time schedule. The network node additionally verifies in block 15 ("Verif"), whether its communication with at least one further network node has been successfully established. A network node may assess position messages on the basis of its own communication time schedule just like in block 9. Incoming position messages can be examined as to whether the position information which contains a statement about the current position of the transmitting network node within the communication cycle, corresponds to the local understanding. A verification time interval is defined which the network node utilizes in the second path in block 15 for verification of its own view with respect to the view of the other network nodes as derived from the received position messages. It comprises at least one communication cycle so that all network nodes can be included in the test. The verification time interval is preferably synchronized with the communication cycle, i.e. it starts at the beginning of the communication cycle. In contrast to the test phase in block 9, the verification time interval is cyclically repeated for as long as no position message has been received in the verification time interval (test phase in block 15). This situation happens e.g. when a network node obtains release by the superior control unit at an earlier time than the other network nodes of the network. This network node then passes through blocks 17, 11 and 14 and enters block 15 before any other network node can react to the specification of the communication time schedule, i.e. can be synchronized thereto. A network node can remain in block 15 for a longer time and wait to be selected as reference network node by one or more network nodes, be transferred to synchronized normal operation via the first path and actively transmit a position message, which the network node in block 15 can receive. If a verification time interval is terminated without receiving a position message, a new verification time interval is started in block 15 and no evaluation and inquiry is carried out in the following inquiry block 16.

During the verification time interval, each network node which communicates the phase position of its local communication time schedule through its position message, is classified into a category. The local phase position of the communication time schedule in the transmitting network node either coincides with that of the predetermining network node in the second path, or they do not coincide. In both cases, a respectively corresponding counter for the coincidences (Z_over) and deviations (Z_less) is incremented and evaluated at the end of the verification time interval. Each network node is considered only once within the verification time interval. The inquiry block 16 is successfully passed only when the majority of the active network nodes process their local communication time schedules synchronously to each other, i.e. Z_over is larger than Z_less.

The network node located in block 15 is called the specification network node. At block 15, this specification network node must consider that it also actively transmits position messages. For this reason, it must consider itself as a synchronized network node in making a decision in the inquiry block 16. This may be effected through previous initialization of the counter Z_over with a count value of one or through adjustment of the inquiry in the inquiry block 16. The transition into synchronized normal operation takes place when Z_over is larger or equal to Z_less. Due to the fact that the specification network node also counts itself during verification of synchronized communication, a critical situation involving only two further network nodes, one of which operates erroneously, can be prevented. If the specification network node is not counted, the specification network node would return to block 17 in case of one correctly functioning network node and a second malfunctioning network node. As long as the remaining two network nodes transmit their position messages while the phase positions of the communication time schedule do not coincide, no further network node may be synchronized since this constellation always causes failure in block 9 and 10 of the first path.

Since the specification network node actively transmits its position message in the second path, it can assume that network nodes in the first path have used it as the reference network node and use this information for the test in block 9. If no errors occur, only position messages are received during the verification time interval which confirm the reference network node in the second path.

If a network node can successfully pass the inquiry "SyncNK?" in inquiry block 16, it enters into synchronized normal operation. If a network node has received at least one position message during a verification time interval and the decision in the inquiry block 16 is therefore due, it must return to block 17 if it is rejected. If the count value Z_over is initiated with the value one at the start of the verification time interval, the network node in the inquiry block 16 is rejected if the count value Z_less is larger or equal to the count value Z_over.

In a highly disturbed environment (e.g. irradiation onto the network) a network node might not be able to leave block 17, since neither correct position messages are received nor does the observation time interval elapse to signal suspense of activity in the network for a fixed duration. If a network should also be synchronized in this case, a reset level must be defined for the network nodes which permits a network node to enter into the second path despite such a situation. Towards this end, a time window counter is started upon entry into block 17, which is not restarted when the network node receives network activity. This time window is larger than the regular observation time interval. If this time window elapses, a network node moves to the second path to block 11 and tries to establish communication. If a network node leaves block 17 before expiration of this time window, the time window counter is stopped. If the network node fails in the first or second path, the time window counter can either be reset or continue from the stored state before entry into the first or second path. Selection of one of these alternatives produces different strategies for the reset level which substantially differ with respect to the time at which a network node enters the second path in consequence of the expired time window.

A network node which has a disturbed receiving circuit (not shown) can still transmit messages but not receive them. Such a network node will enter the second path since, within the observation time interval in block 17, no network activity can be observed (even if other network nodes are e.g. in synchronized normal operation). It will always remain in block 15 since the inquiry block 16 will not permit passage of the network node into synchronized normal operation. The network node still permanently transmits its position message and disturbs the possibly parallel running communication of other network nodes. A further reset level may be defined as a remedy, which provides, after expiration of a fixed time during which the network node cannot be synchronized via the second path, that a network node loses authorization for entry into the second path. A counter may be defined which counts the number of communication cycles during which the network node was in the second path. When the counter reaches a fixed limit value, the network node can no longer pass the inquiry block 19 in the direction of block 11. Only passive integration via the first path is still possible for this network node. This state can be eliminated only by the superior control unit.

An additional rule for the inquiry block 19 may be defined which specifies that a network node may enter the second path only when the superior control unit provides special release. In this case, active trial of a network node to establish communication is not possible until explicitly allowed by the superior control unit. In this phase, the network node can be integrated into running communication via the first path. The superior control unit in a network node thereby controls in which role, i.e. via which path, the network node enters the communication.

If a network node is not given transmission right by the superior control unit in the network node, the network node cannot enter the second path but may be synchronized with a predetermined communication time schedule via the first path. Withholding of the transmission right may be advantageous e.g. if, for diagnosis, only communication shall be monitored without active participation. For transfer into synchronized normal operation, wherein the network node is still passive, the same rules are valid for the inquiry block 10 as for the network nodes which do not transmit their own position message.

The synchronization of the phase positions of the local communication time schedules within the network nodes is the required precondition for performance of the media access method in normal operation and thereby the deterministic data exchange using the interconnecting network. Moreover, further parameters may be locally administered in a network node which must be globally matched. One example is a counter for the communication cycles which is locally administered in the respective network nodes. If its current count value is transmitted with a message, the count value may be used by the receiver to validate the co-transmitted data by comparing the transferred count value with the local count value. Moreover, the measuring phase of the global clock synchronization can e.g. be synchronized throughout the network using the local count value of a cycle counter in the respective network node.

Such a cycle counter may also be used to fill the data fields within a message with different contents in dependence on the current cycle count value. The receiver can evaluate this decision on the basis of its own cycle counter which is synchronized with that of the transmitter, without having to transfer information about the content. For such parameters as the above-described cycle counter, the same method may be used as described for synchronization of the phase positions of the communication time schedules. A network node can thereby distribute its parameter set in the second path (e.g. the count value of the cycle counter) to all network nodes which use same for initiating their local parameter sets (e.g. cycle counter). The examination mechanisms are analogously used. The above described position message may also contain further parameters and the counters for agreement (Z_over) are incremented in the block 9 and block 15 phases only if all parameters to be synchronized agree. In case of one or more deviations within the parameter set, the corresponding counter (Z_less) is incremented.

In networks with which each network node is provided with its own cycle source, different cycle frequencies could occur in practice, even if all cycle sources operate at the same nominal frequency. In dependence on the cycle source used, initial tolerances of the actual frequency and further frequency changes, e.g. through ageing, cannot be prevented. During normal synchronized operation, the above-described global clock synchronization ensures that the temporal position and length of the communication time schedules of all network nodes coincide within the resolution or accuracy which is specific for the network. A network node can perform synchronization through adjustment of the phase of its communication time schedule only when the frequency differences or inaccuracies of the local cycle sources are small. It must be ensured that the communication time schedules are not shifted relative to each other between the phases of blocks 8 and 9 or 14 and 15. The measures for synchronization during running operation must then be started only upon entry into synchronized, normal operation.

For networks having cycle sources with large tolerances (used e.g. for reasons of cost) or wherein, due to the long service live, high deviations from the nominal frequency must be expected, the above-mentioned assumption cannot be guaranteed. In this case, the communication time schedules would be shifted between the phases of blocks 8 and 9 or 14 and 15, which prevents synchronization.

Figure 6:
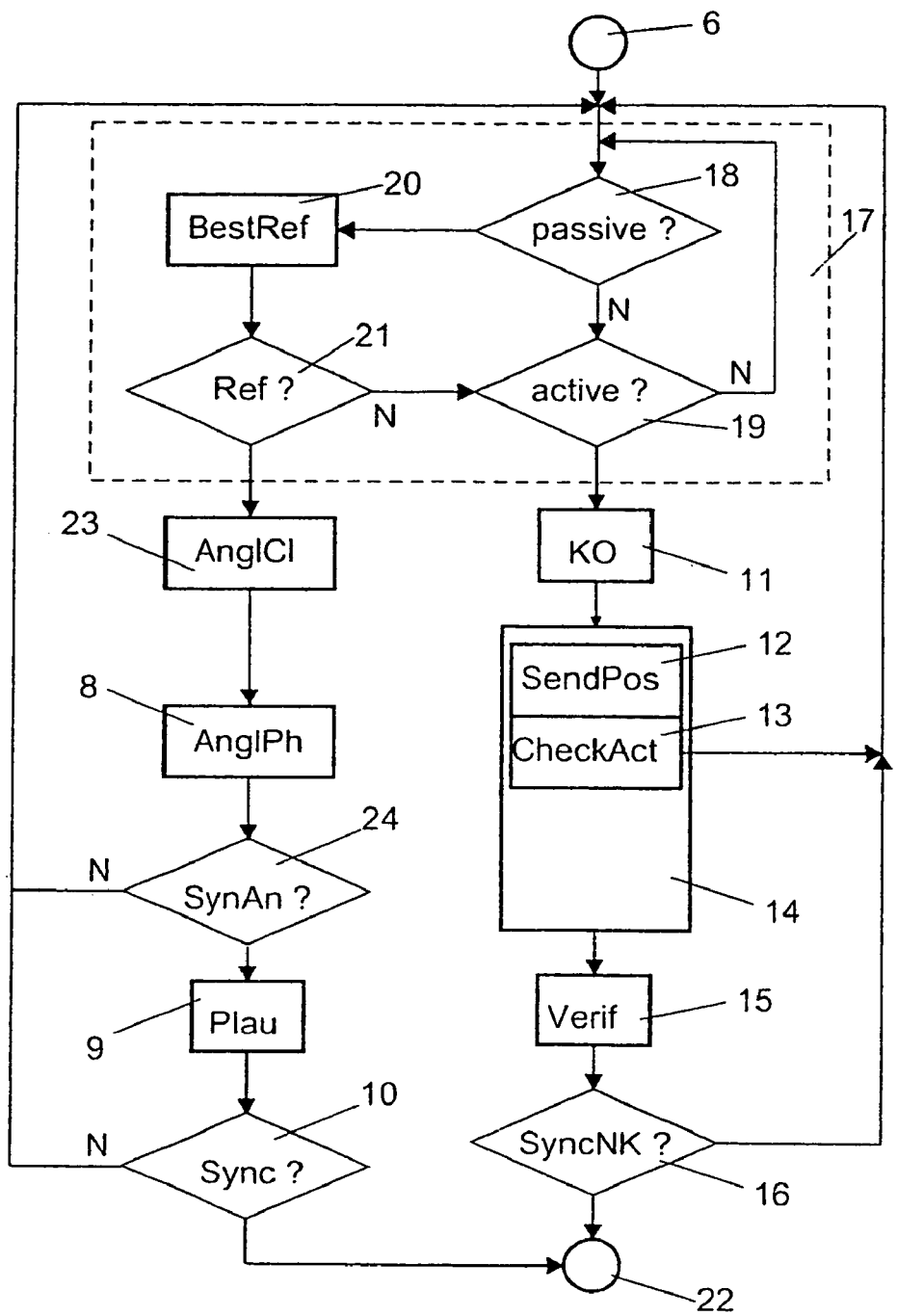
FIG. 6 shows a second flow chart which can be applied in a network node.

To solve this problem, the flow chart shown in FIG. 2 in accordance with the invention is supplemented by further blocks to obtain the extended flow chart shown in FIG. 6. The first path is supplemented by a block 23 between inquiry block 21 and block 8 and by an inquiry block 24 between blocks 8 and 9.

Block 23 performs adjustment of the local clock cycle of the integrating network node to the reference network node. A measuring phase is thereby started in the network node upon first occurrence of the position message of the reference network node and is stopped by the second occurrence of the position message of the reference network node. The duration of the communication cycle of the reference network node for the network node in the first path is thereby known. The local clock cycle of the network node and the corresponding duration of its local communication cycle is subsequently adjusted to the clock cycle of the reference network node. This phase is shown in block 23 by "AnglCl". The network node subsequently operates with the adjusted clock cycle (e.g. in the phase "AnglPh").

After adjustment of the local clock cycle, the phase position of the local communication time schedule is adjusted to the phase position of the communication time schedule of the reference network node using only the second position message of the reference network node (in block 8). If the second position message has not occurred after expiration of a dwell time interval, the network node returns to the initial phase, i.e. to block 17. This inquiry is carried out in the inquiry block 24 and is designated with "SynAn?". The duration of this dwell time interval must be at least equal to the duration of a communication cycle and the maximum possible offset between the phase positions of the local communication cycles of two non-synchronized network nodes. When the network node returns to the initial phase, the local clock cycle of the network node is reset to the nominal setting. This means that the correction for adjustment of the clock cycle to the reference network node is reversed.

The above-described measures can be extended such that a network node already carries out the above-described measures for error-tolerant global clock synchronization in the first path of the flow chart during the test phase in block 9. A network node thereby evaluates the synchronization information of all received position messages, i.e. it determines the deviation in the phase position between the local communication time schedules of the transmitting network nodes and of its own communication time schedule during the test phase in block 9. A network node in the first path can be transferred into synchronized normal operation only if the method for global error-tolerant clock synchronization which is based on the position messages received during the test phase in block 9 signals that synchronization was obtained within the limits of possible accuracy. If correction terms were determined which show that the network node is beyond the admissible time deviation, the network node must be rejected at inquiry block 10.

The global clock synchronization is based on a pattern which consists of the measuring phase for correction term determination and the correction phase for adjusting the local phase position of the communication time schedule and possibly for adjustment of the local clock cycle. If e.g. two successive communication cycles are required for the measuring phase to be able to determine a correction term for the local clock cycle and if the correction phase for adjustment of the phase position of the communication time schedule must not disturb the measuring phase, all network nodes of a network must uniformly follow the same synchronized flow scheme which consists of measuring and correction phase. This period which consists e.g. of two communication cycles, must be synchronized to a pattern in all network nodes which can then be supported by the cycle counter. This pattern may e.g. always start with a communication cycle with even count value. A network node located in block 17 may then enter into the first path only if it receives a position message with a count value which ensures synchronization with the pattern. Rejection can be ensured by the inquiry block 21. Before entry into the test phase in block 8, a network node sets its local cycle counter to that value which it can derive from the received position message of the reference network node. By means of the cycle counter, the network node is synchronized to a pattern which must be uniformly processed in the overall network. For this reason, the value of the cycle counter must be compared with those of the other active network nodes within the test phase in block 9. Agreement is a requirement for transfer into synchronized normal operation as must be additionally ensured through inquiry block 10.

A network node in the second path can also carry out the measures for error-tolerant global clock synchronization during the test phase in block 15. A network node in the second path can pass into synchronized normal operation only if the methods for clock synchronization, based on the position messages received during the test phase in block 9, signal that synchronization was obtained within the limits of possible accuracy. Otherwise, the network node is rejected in inquiry block 16.

In the above-described method, the position message also combines the features of a synchronization message per se. This means that the exact temporal occurrence of this synchronization message is measured by receiving network nodes and compared with the expected receiving time, to determine the deviation between the position of the local communication time schedules of the receiving network node and of the reference network node and thereby between the local clocks. A comparison, i.e. formation of the difference between two successive deviation terms, determined from the synchronization message of the same network node permits determination of a correction term for the local clock cycle. For synchronization message it is also true that a receiving network node must be able to associate the synchronization message uniquely with the corresponding reference network node. To determine the correction terms from all measured deviations, it must be ensured that several synchronization messages of a network node do not produce an imbalance of the average value formation. If only one synchronization message per network node is permissible in the communication time schedule, determination of the associated reference network node from the synchronization message can be omitted.

The method can also be realized if the features of the position messages and the synchronization messages are not combined in one message but if these messages are entered separately in the communication time schedule. Both messages of one network node in the second path must always be transmitted within a communication cycle and the network nodes in the first path or in the second path must always take into consideration both messages and their information content in the block 9 and 15 phases. A position message within a time interval of the block 9 or 15 phases, without the associated synchronization message, (and vice versa) can therefore not be used for evaluation.

We claim:

1. A network system, the system comprising:
an interconnecting network;
a reference network node communicating with said interconnecting network, said reference node having a reference node communication time schedule; and
a plurality of network nodes coupled to said interconnecting network, said network nodes each being adapted to detect, before integration as an active network node, whether or not there is any activity of other network nodes and, if no activity is detected, to assign itself as said reference network node and to transmit position messages predetermined in a communication schedule to other network nodes, and each network node is adapted to select, if activity is detected, a network node from which a position message is received as said reference network node and to adjust its local communication time schedule to said reference node communication time schedule, wherein each network node is adapted to integrate as an active network node in case of a positive result of an agreement check between said local communication time schedule and communication time schedules of at least a part of active network nodes.

2. The network system of claim 1, wherein each network node is adapted for examination of whether its local communication time schedule coincides with communication time schedules of at least part of said active network nodes and for counting agreements and deviations, wherein each network node is adapted for integration as an active network node only when a number of agreements is larger than a number of deviations.

3. The network system of claim 2, wherein each network node, for examination as to whether its said local communication time schedule coincides with the communication time schedules of at least part of said active network nodes, is provided with a time interval, in which all position messages of said active network nodes can be transmitted at least once.

4. The network system of claim 1, wherein, after detection of no activity, a network node to be integrated is adapted to examine whether a further network node attempts to integrate itself as said reference network node.

5. The network system of claim 4, wherein, after detection of no activity, a network node to be integrated is adapted to transmit a collision message.

6. The network system of claim 4, wherein during examination for integration as a reference network node, each network node is adapted to initially transmit its own position message, to count incoming position messages, and to be integrated as said reference network node only if a number of correctly received position messages is larger than a number of the incorrectly received position messages.

7. A network node in a network system, the system comprising:
   an interconnecting network;
   a reference network node communicating with said interconnecting network, said reference node having a reference node communication time schedule; and
   a plurality of network nodes coupled to said interconnecting network, said network nodes each being adapted to detect, before integration as an active network node, whether or not there is any activity of other network nodes and, if no activity is detected, to assign itself as said reference network node and to transmit position messages predetermined in a communication schedule to other network nodes, and, if activity is detected, to select a network node from which a position message is received as said reference network node and to adjust its local communication time schedule to said reference node communication time schedule, wherein each network node is adapted to integrate as an active network node in case of a positive result of an agreement check between said local communication time schedule and communication time schedules of at least part of active network nodes.

8. A method for integrating a network node as an active network node in a network system, the network system having a reference network node and an interconnecting network for connecting together a plurality of network nodes and the reference network node, the method comprising the steps of:
   a) detecting, before integrating as an active network node, whether or not there is any activity of other network nodes;
   b) if no activity is detected in step a), transmitting position messages predetermined in a communication time schedule to other network nodes;
   c) if activity is detected in step a), selecting a network node from which a position message is received as said reference network node and adjusting a local communication time schedule to said reference network node based on receipt of position messages from said reference network node;
   d) testing for agreement between the local communication time schedule and communication time schedules of at least part of active network nodes; and
   e) integrating into the network system as an active network node if step d) yields a positive result.

* * * * *